United States Patent [19]

Jacobsson

[11] Patent Number: 4,641,088
[45] Date of Patent: Feb. 3, 1987

[54] ROOT MEAN SQUARE MEASURING DEVICE FOR NEGATIVE SEQUENCE CURRENT

[75] Inventor: Curt Jacobsson, Västerås, Sweden

[73] Assignee: Asea Aktiebolag, Västerås, Sweden

[21] Appl. No.: 698,822

[22] Filed: Feb. 6, 1985

[30] Foreign Application Priority Data

Feb. 7, 1984 [SE] Sweden ............................ 8400621

[51] Int. Cl.$^4$ ............................................. G01N 25/00
[52] U.S. Cl. ................................... 324/86; 324/83 R
[58] Field of Search .................... 324/83 R, 83 A, 86; 307/127; 361/85; 328/139

[56] References Cited

U.S. PATENT DOCUMENTS

| | | | |
|---|---|---|---|
| 4,210,948 | 7/1980 | Waltz | 324/86 |
| 4,342,062 | 7/1982 | Hodges | 324/86 |
| 4,447,893 | 5/1984 | Massey | 324/86 |

*Primary Examiner*—Michael J. Tokar
*Attorney, Agent, or Firm*—Watson Cole Grindle & Watson

[57] ABSTRACT

To protect electrical three-phase machines from damage on the appearance of an unbalanced load between the phases, so-called negative sequence current protection is used. Conventional measurement of the negative sequence current takes place in filters which contain frequency dependent LC components. Frequency variations in a three-phase supply, because of an unbalanced frequency response for harmonics in the three phase filters, may lead to an erroneous indication of negative sequence current. The invention provides a novel method for determining both the positive sequence and the negative sequence currents to a three-phase load. For grounded systems the zero-sequence current is eliminated. Measuring each phase current ($I_R$, $I_S$, $I_T$) and the phase sequence, the positive sequence and/or negative sequence current are/is determined as the solution of an equation derived in advance from the electrical relationships between the phase currents. The invention also relates to a device for carrying out the method.

9 Claims, 12 Drawing Figures

ROOT MEAN SQUARE MEASURING DEVICE FOR NEGATIVE SEQUENCE CURRENT

BACKGROUND OF THE INVENTION

1. Technical Field

The electrical current which is supplied to a load, e.g. a three-phase electrical machine, is normally of equal amplitude in all the phases. The phase displacement between the currents is also normally the same and, in a three-phase network equals 120°. In the cases of an unbalanced load, an interruption in one phase, or the appearance of an abnormal operating condition such as, for example, a single-phase or two-phase short-circuit, the phase currents will become unbalanced. It is generally known that three-phase electrical machines of many different kinds are sensitive to an unbalanced load and may be destroyed if the unbalanced load becomes excessive.

A measure of the degree of unbalanced load can be obtained by reference to the so-called negative sequence current, which is a symmetrical three-phase current with equal amplitude in all phases but with negative phase sequence. The actual unbalanced current caused by the unbalanced load being quantified consists of this negative sequence current with the addition of two other symmetrical three-phase currents; namely one with positive phase sequence and one with zero phase sequence. The three sequence currents may have different amplitudes. The negative sequence currents generate a stator magnetomotive force (mmf) having a negative phase sequence and with the same rotational speed as the stator field of the machine but with the opposite direction of rotation. This mmf therefore rotates relative to the rotor at a rate equal to twice the supply frequency. This leads to currents with twice the supply frequency being induced in the metallic parts of the rotor, for example in the damper windings. It is these induced higher frequency currents that may eventually damage the rotor if the negative sequence current is too large and subsists for too long a period of time.

To protect an electrical machine from damage caused by such an unbalanced load, a so-called negative current protection, based on a measurement of the negative sequence current, is therefore provided. In order to obtain a measure of the negative sequence current from the mains currents in question, presently known negative current protectors include a measuring device in the form of a filter containing resistors and inductances or capacitors. The present invention relates to a new method and a new device for obtaining a measure of this current without the use of R-, L- or C-components.

2. Description of the Prior Art

From a general point of view, the procedure adopted when resolving an unbalanced three-phase current in a network into a symmetrical negative and positive current system will be different depending on whether the network is grounded or not. If the network is not grounded, the unbalanced current may be resolved, as previously mentioned, into a negative and a positive sequence current, the negative sequence current having negative phase sequence and the positive sequence current having positive phase sequence relative to the network. FIG. 1 of the accompanying drawings illustrates an unbalanced load, and FIG. 2 thereof illustrates the corresponding positive and negative sequence currents and the phase sequences in the case of an ungrounded network.

When the network is grounded, an unbalanced load will, in addition, give rise to a zero sequence current, which means that the resolution will comprise a zero phase sequence system which in a three-phase system consists of three single-phase quantities which are equal in amplitude and phase. The resolution of a grounded network with an unbalanced load could be as shown in FIG. 3 of the accompanying drawings.

Since the phase currents of the negative sequence system are equal, it is only necessary to measure one of these currents. As will be described, in an ungrounded system the negative sequence current, or a signal proportional thereto, can be measured with the aid of two of the phase currents in the network in question. In a grounded system all the phase currents have to be measured in a special connection, to eliminate the zero sequence current, as will be clear from the following analysis given with reference to FIG. 8 of the accompanying drawings.

The resolving of the phase currents, to obtain a measure of the negative sequence current, takes place in accordance with a known procedure in a so-called negative current filter. Such a filter is described in the specification of U.S. Pat. No. 3,699,411. A modified negative current filter is illustrated in FIG. 4 of the accompanying drawings and will now be described in more detail. The filter shown in FIG. 4 comprises a resistor $R_1$ in parallel with an inductance $L_1$. The parallel connection is supplied with a current corresponding to the phase current $I_T$, a voltage $\overline{U}_1$ thus appearing across the connection. Further, the filter comprises a series connection of an inductance $L_2$ and a resistor $R_2$, which is traversed by a current corresponding to the phase current $I_R$. Across the series connection a voltage $\overline{U}_2$ appears. By a suitable dimensioning of the components included in the filter, it can be shown that the output signal $\overline{U}$ of the filter, when no negative sequence current exists, i.e. when the network is symmetrically loaded, is zero and that, when a negative sequence current exists, the output voltage $\overline{U}$ represents a signal proportional to the negative sequence current.

In a symmetrically loaded network, all the phase currents $I_R$, $I_S$ and $I_T$, as shown in FIG. 5 of the accompanying drawings, are equal in amplitude and displaced in phase 120° with respect to each other. Taking $I_R$ as the reference phase, $\overline{U}_2$ is formed as the resultant of $I_R R_2$ in phase with $I_R$ and $I_R X_{L2}$, displaced in phase 90° with respect to $I_R$. Since $X_{L2}$ is frequency dependent, the locus of $I_R X_{L2}$ is a straight line on which $I_R X_{L2}$ has been marked for the rated frequency $f_n$ as well as for $0.8 \cdot f_n$ and for $1.2 \cdot f_n$.

Because of the current directions indicated in the filter of FIG. 4, in order to determine $\overline{U}_1$ it is necessary to start from the phase current $-\overline{I}_T$, that is, $-I_R < 120°$. The locus of $\overline{U}_1$ is a semi-circle, on the periphery of which have been marked, the end points of the vector $\overline{U}_1$ at the respective rated frequencies $f_n$, $0.8 \cdot f_n$ and $1.2 \cdot f_n$.

By suitable dimensioning and trimming, $\overline{U}_1$ will be equal to $\overline{U}_2$, and since $\overline{U}$ is the voltage between the end points of the vectors $\overline{U}_1$ and $\overline{U}_2$, $\overline{U}$ will be equal to 0.

On studying the conditions during unbalanced load, the negative sequence current diagram of FIG. 2 can be the starting-point. Taking $I_{R-}$ as the reference phase, the voltage $\overline{U}_2$ is formed, as shown in FIG. 6 of the accompanying drawings, in the same way as in the previously described symmetrical case. Because of the reversed phase sequence of the negative sequence system and the current direction of $I_T$ indicated in the filter of FIG. 4, it will be necessary also in this case to start from $-I_{T-}$, that is, $-I_R<240°$. The locus of $\overline{U}_1$ consists of the semi-circle shown in FIG. 6. The output signal $\overline{U}$ of the filter is clear from FIG. 6, and the absolute value of the vector is proportional to the negative sequence current and thus constitutes a measure of this current.

The current feed to the negative current filter of the type shown for an ungrounded system will be clear from FIG. 7 of the accompanying drawings. In addition to current transformers $S_R$ and $S_T$, this figure also shows auxiliary current transformers $M_R$ and $M_T$.

For a grounded system, in order to eliminate a possible zero sequence current, all the phase currents must be measured, which is done by means of current transformers $S_R$, $S_S$ and $S_T$ (see FIG. 8 of the accompanying drawings). Auxiliary current tranformers $M_1$ and $M_2$ are also included and the connection of these is shown in FIG. 8.

Negative current filters, whether according to the above-mentioned U.S. Pat. No. 3,699,441 or the filters described here, suffer from certain drawbacks. As will be clear from FIG. 5, the filter will deliver an output voltage also in the case of a balanced load system when the frequency varies, since $\overline{U}_1$ and $\overline{U}_2$ are different. Also in the case of dynamic and transient changes in the network, the filter is able to deliver a signal without there being any negative sequence current in the network. Harmonics on the network may also result in the filter delivering an output signal because of different frequency responses in the three phases.

Such fault indications may give rise to unjustified alarm, blocking or tripping.

As will have become clear, the current in each phase in a system with unbalanced load can be resolved into a negative and a positive sequence component and possibly, if the system is grounded, into a zero sequence component. In the analyses shown in FIGS. 1 and 2, $I_{R1}$ has been resolved into $I_{R+}$ and $I_{R-}$ with the angle $\theta$ between the components, as will be clear from FIG. 9 of the accompanying drawings. The relationship between $I_{R1}$, $I_{R+}$ and $I_{R-}$ can be described with the aid of the cosine theorem. For the S- and T-phases corresponding relationships arise so that a characteristic of the system is that $|I_{R+}|=|I_{S+}|=|I_{T+}|=|I_1|$ and that $|I_{R-}|=|I_{S-}|=|I_{T-}|=|I_2|$ and that the phase angles between the resolved positive and negative sequence currents, respectively, are 120°. For the R-phase, the following equation is valid:

$$I_R^2 = I_1^2 + I_2^2 - 2I_1I_2 \cos \theta$$

where
$|I_1|$ = Positive sequence component and
$|I_2|$ = Negative sequence component.

Corresponding equations can be deduced for the S- and I-phases, which gives three equations with three unknowns, so that by making a current measurement of all the phase currents, it is possible to calculate both the negative and the positive sequence component as well as the angle $\theta$.

SUMMARY OF THE INVENTION

This invention relates to a method for determining the positive sequence current ($I_1$) and the negative sequence current ($I_2$) in a network when an unbalanced load occurs. With the aid of measured phase currents ($I_R$, $I_S$, $I_T$) and measured phase sequence (RST, RTS) the positive sequence and/or negative sequence current, if any, are/is calculated. The method is characterized in that with the aid of measured phase currents, which are formed while eliminating any zero sequence current, and with the present phase sequence information, the positive sequence and/or negative sequence current are/is determined by an arithmetical expression $$I_{1,2} = \sqrt{|A \pm \sqrt{|A^2 - B|}\,|}$$

the parameters (A, B) of which consist of algebraical combinations of measured phase currents.

The invention also extends to a device for carrying out the above-noted method.

BRIEF DESCRIPTION OF THE DRAWINGS

The invention will now be further described, by way of example, with reference to the nine Figures already referred to and to the three further Figures shown on the accompanying drawings, the various Figures of which can be briefly described as follows.

MATHEMATICAL BASIS OF THE INVENTION

Figure 1:
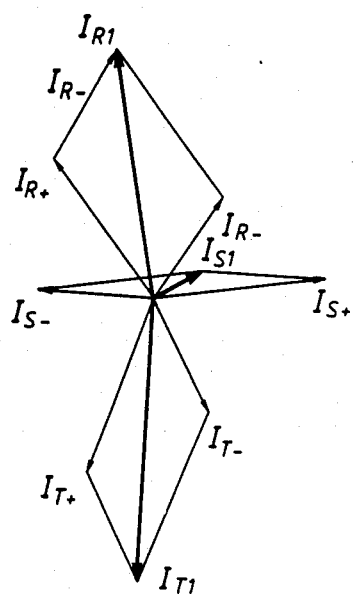
FIG. 1 shows one example of the currents in a nongrounded network with an unbalanced load.
Figure 2:
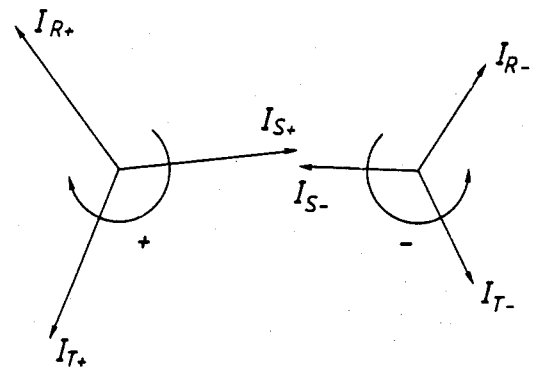
FIG. 2 shows how the phase currents in FIG. 1 can be resolved into negative and positive sequence currents.
Figure 3:
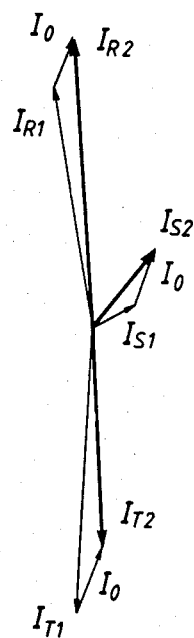
FIG. 3 shows the phase currents, the negative and positive sequence currents and the zero sequence currents in the case of an unbalanced load in a grounded system.
Figure 3:
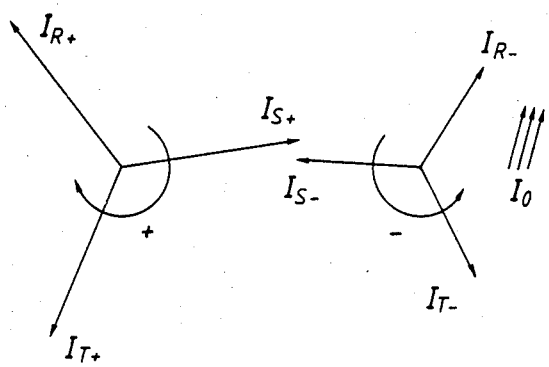
Figure 4:
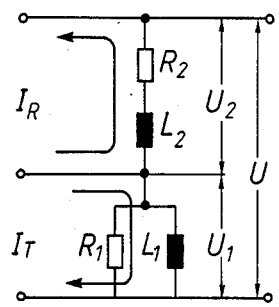
FIG. 4 shows one embodiment of a known type of negative current filter.
Figure 5:
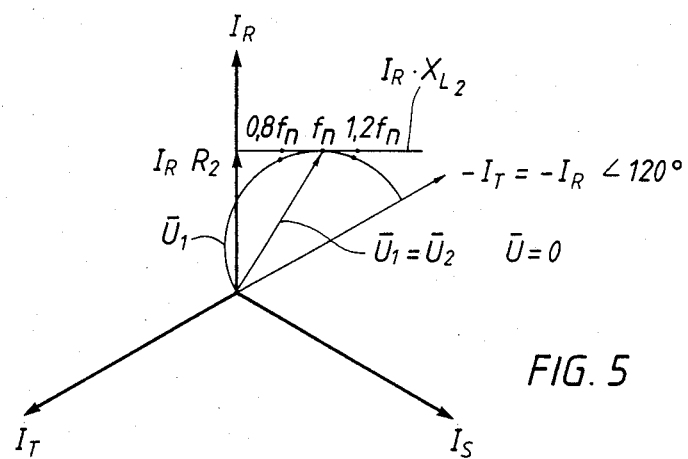
FIG. 5 shows how the output signal of the filter of FIG. 4 is composed in a symmetrically loaded network.
Figure 6:
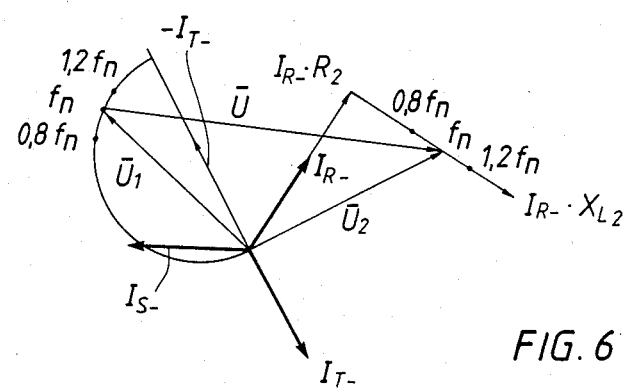
FIG. 6 shows how the output signal of the filter of FIG. 4 is composed in a non-grounded network with an unbalanced load.
Figure 7:
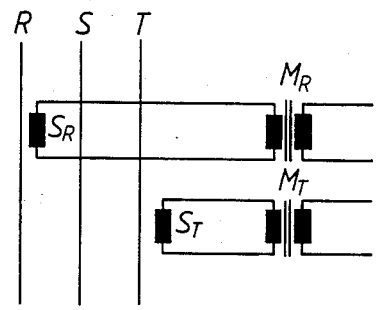
FIG. 7 shows how the filter of FIG. 4 can be supplied with current during negative sequence current measurement in a non-grounded system.
Figure 8:
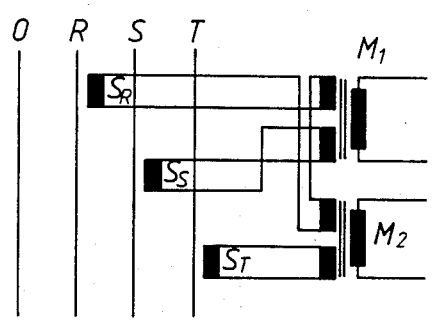
FIG. 8 shows how the filter of FIG. 4 can be supplied with current during negative sequence measurement in a grounded system.

The equation system for all phase currents is as follows:

$$I_R^2 = I_1^2 + I_2^2 - 2I_1 \cdot I_2 \cos\theta \qquad (1)$$

$$I_S^2 = I_1^2 + I_2^2 - 2I_1 \cdot I_2 \cos(\theta - 120°) \qquad (2)$$

$$I_T^2 = I_1^2 + I_2^2 - 2I_1 \cdot I_2 \cos(\theta + 120°) \qquad (3)$$

By subtracting equation (2) from equation (1) the following is obtained $$I_S^2 - I_R^2 = 2I_1 \cdot I_2 \cos\theta - 2I_1 \cdot I_2 \cos(\theta - 120°) \qquad (4)$$

and subtracting equation (3) from equation (1) gives $$I_T^2 - I_R^2 = 2I_1 \cdot I_2 \cos\theta - 2I_1 \cdot I_2 \cos(\theta + 120°) \qquad (5)$$

With the aid of known trigonometrical transformation formulae and the insertion of values for sin 120° and cos 120°, equations (4) and (5) can be written as $$I_S^2 - I_R^2 = I_1 \cdot I_2 (3\cos\theta + \sqrt{3} \sin\theta) \qquad (6)$$

$$I_T^2 - I_R^2 = I_1 \cdot I_2 (3\cos\theta - \sqrt{3} \sin\theta) \qquad (7)$$

By adding equations (6) and (7), the following is obtained $$I_S^2 + I_T^2 - 2I_R^2 = 6 I_1 \cdot I_2 \cos\theta \qquad (8a)$$

i.e. 
$$2I_1 \cdot I_2 \cos\theta = \frac{I_S^2 + I_T^2 - 2I_R^2}{3} \qquad (8b)$$

Insertion of the equality of equation (8b) in equation (1) gives $$I_R^2 = I_1^2 + I_2^2 - \frac{I_S^2 + I_T^2 - 2I_R^2}{3} \qquad (9)$$

By forming the difference between equations (6) and (7) the following equation is obtained $$I_S^2 - I_T^2 = I_1 \cdot I_2 \cdot 2\sqrt{3} \sin\theta \qquad (10)$$

After certain conversions, the quotient (10)/(8a) gives $$\tan\theta = \sqrt{3} \; \frac{I_S^2 - I_T^2}{I_S^2 + I_T^2 - 2I_R^2} \qquad (11)$$

By solving equation (10) with respect to $I_1$ and insertion into equation (1), the following equation is obtained, after intermediate calculations $$I_2^2 - \frac{I_S^2 - I_T^2}{\sqrt{3} \tan\theta} + \frac{(I_S^2 - I_T^2)^2}{12 I_2^2 \sin^2\theta} - I_R^2 = 0 \qquad (12)$$

Insertion of $\tan\theta$ according to equation (11) gives $$I_2^4 - I_2^2 \cdot \frac{I_R^2 + I_S^2 + I_T^2}{3} + \frac{(I_S^2 - I_T^2)^2}{12 \sin^2\theta} = 0 \qquad (13)$$

Elimination of $\sin^2\theta$ in equation (13) is done with the aid of equation (11) which after insertion in the trigonometrical relationship $$\sin^2\theta = \frac{\tan^2\theta}{1 + \tan^2\theta} \text{ gives} \qquad (14)$$

$$\sin^2\theta = \frac{3(I_T^2 - I_S^2)^2}{(I_S^2 + I_T^2 - 2I_R^2)^2 + 3(I_T^2 - I_S^2)^2}$$

Insertion of this value into equation (13), after intermediate calculations, gives $$I_2^4 - I_2^2 \cdot \frac{I_R^2 + I_S^2 + I_T^2}{3} + \qquad (15)$$

$$\frac{I_R^4 + I_S^4 + I_T^4 - I_R^2 I_S^2 - I_R^2 I_T^2 - I_S^2 I_T^2}{9} = 0$$

By setting $$2A = \frac{I_R^2 + I_S^2 + I_T^2}{3} \qquad (16)$$

and $$B = \frac{I_R^4 + I_S^4 + I_T^4 - I_R^2 I_S^2 - I_R^2 I_T^2 - I_S^2 I_T^2}{9} \qquad (17)$$

equation (15) changes into $$I_2^4 - 2A\, I_2^2 + B = 0 \qquad (18)$$

with solution $$I_2 = \sqrt{A \pm \sqrt{A^2 - B}} \qquad (19)$$

and since imaginary currents are of no interest, equation (19) can be written as $$I_2 = \sqrt{|A \pm \sqrt{|A^2 - B|}\,|} \quad I_1 = \sqrt{|A \pm \sqrt{|A^2 - B|}\,|} \qquad (20)$$

Information about which of the signs ± under the square root sign in equation (20) is to be used, will be determined by the phase sequence of the network. It can also simply be shown that equatiuon (20) can be used for calculating the positive sequence current $I_1$. The relationships between the ± signs under the square root sign, phase sequence and positive sequence and negative sequence currents will be clear from the following table:

| phase sequence | current $I_1$ | $I_2$ |
|---|---|---|
| RST | + | − |
| RTS | − | + |

The arithmetical operations needed to obtain $I_1$ and/or $I_2$ from a knowledge of the phase sequence of the network are relatively simple, as will have been made clear already, and may be implemented in a great number of ways in practice.

DESCRIPTION OF THE PREFERRED EMBODIMENT

Figure 10:
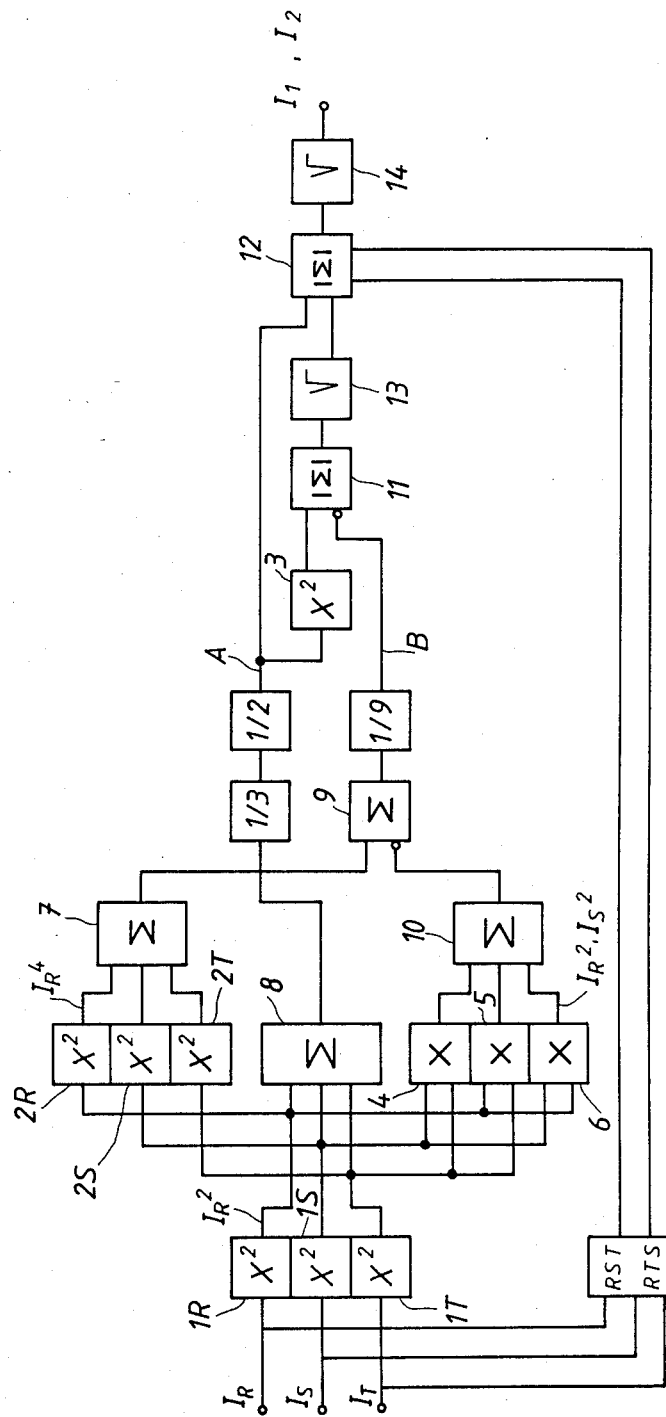
FIG. 10 shows a circuit for calculating positive sequence and negative sequence currents in accordance with the method of the present invention.

A diagram of a circuit operating in accordance with the method of the invention is shown in FIG. 10 and includes squaring components 1R, 1S, 1T, 2R, 2S, 2T and 3, multiplying components 4, 5 and 6; adding components 7, 8, 9 and 10; adding and forming the absolute value components 11 and 12, and square root forming components 13 and 14. Phase sequence determination is performed by a member 15. The functions mentioned can be achieved by means of analog techniques, by means of digital techniques or by a combination of both techniques. The schematic operating diagram shown in FIG. 10 can directly represent one embodiment of circuit which employs pure analog techniques. Implementation can be effected by analog RMS formation of the input signals.

Figure 11:
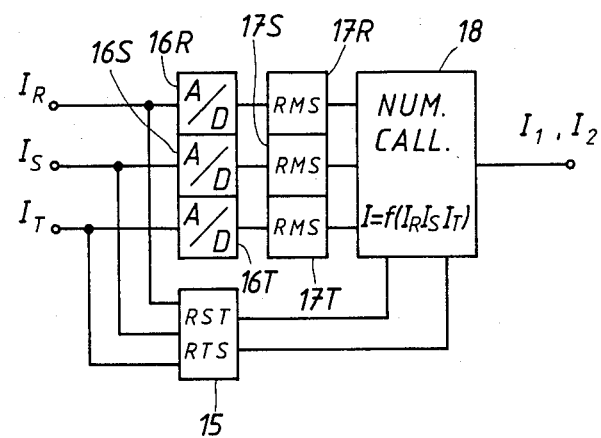
FIG. 11 shows a circuit digital calculation of positive sequence and negative sequence currents also in accordance with the invention.

FIG. 11 illustrates one embodiment utilizing pure digital techniques. The incoming analog phase currents $I_R$, $I_S$ and $I_T$ are converted into digital values in A/D convertors 16R, 16S and 16T. The digital values of the phase currents are RMS-processed in RMS means 17R, 17S and 17T and are passed on for calculation, according to equation (20), in a suitably designed processor 18 which is also supplied with information about the phase sequence in question via a member 15.

Clearly, other embodiments with a higher or lower degree of integration of the members 15-18 as shown in FIG. 11 are embraced by the present invention. Similarly hybrid solutions which employ a combination of analog and digital techniques for the different members and functions are also included within the scope of this invention.

When a possible positive sequence or negative sequence current exceeds a pre-set value, a tripping signal can be generated. Tripping can also be arranged to occur in a simple manner in accordance with various inverse time curves.

Figure 9:
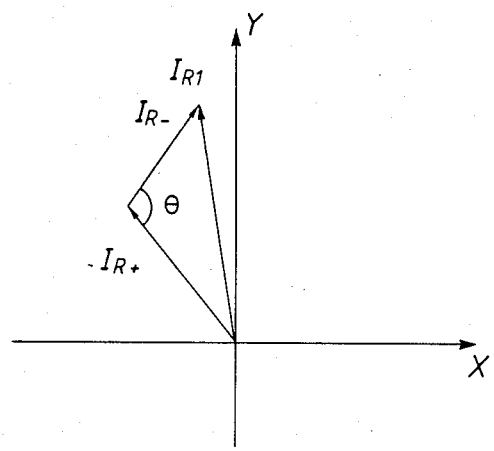
FIG. 9 shows how a phase current $I_{R1}$ is resolved into a negative sequence current $I_{R-}$ and a positive sequence current $I_{R+}$.
Figure 12:
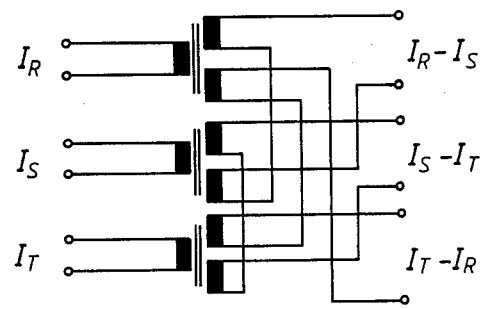
FIG. 12 shows how the auxiliary current transformers in a device according to the invention can be connected to make the measuring device independent of whether or not the network is grounded.

As will be clear from the foregoing description, a measuring device according to the invention always needs to be supplied with all the phase currents. To avoid the need to have different designs of input circuits depending on whether the network is grounded or not, in accordance with known techniques, a connection is used which, in principle, is similar to that shown in FIG. 9 but with the primary and secondary sides reversed. The precise connection proposed is shown in FIG. 12, from which it will be seen that the three phase currents are transformed into an equivalent system without a zero sequence component.

What is claimed is:

1. A method for determining at least one of the positive sequence current $I_1$ and the negative sequence current $I_2$ in a three-phase electrical network under unbalanced load conditions, comprising:

measuring each phase current $I_R$, $I_S$ and $I_T$ and the phase sequence RST and RTS;

calculating the $I_1$ and $I_2$ in accordance with the following formula:

$$I_1, I_2 = \sqrt{|A \pm \sqrt{|A^2 - B|}\,|}$$

wherein $A = I_R^2 + I_S^2 + I_T^2/6$ and $$B = \frac{I_R^4 + I_S^4 - I_T^4 - I_R^2 I_S^2 - I_R^2 I_T^2 - I_S^2 I_T^2}{9}$$

and for the phase sequence RST, $I_1$ and $I_2$ are respectively + and −, and for the phase sequence RTS, $I_1$ and $I_2$ are respectively − and +.

2. Apparatus for determining at least one of the positive sequence current $I_1$ and the negative sequence current $I_2$ in a three-phase electrical network under unbalanced load conditions, comprising:

means for calculating the positive and negative sequence currents from the measured phase currents $I_R$, $I_S$ and $I_T$ in accordance with the following formula:

$$I_1, I_2 = \sqrt{|A \pm \sqrt{|A^2 - B|}\,|}$$

wherein $A = I_R^2 + I_S^2 + I_T^2/6$ and $$B = \frac{I_R^4 + I_S^4 + I_T^4 - I_R^2 I_S^2 - I_R^2 I_T^2 - I_S^2 I_T^2}{9}$$

and;

means for determining the phase sequences RST and RTS, and for the phase sequence RST, $I_1$ and $I_2$ are respectively + and −, and for the phase sequence RTS, $I_1$ and $I_2$ are respectively − and +.

3. Apparatus as claimed in claim 2 wherein said means for calculating includes first means for squaring said phase currents $I_R$, $I_S$ and $I_T$, first means for summing said squared quantities, second means for squaring said squared quantities and means for multiplying said first squared quantities to produce $I_R^2 I_S^2$, $I_R^2 I_T^2$ and $I_S^2 I_T^2$, said neans for calculating further including second means for summing the output of said means for multiplying and third means for summing the output of said means for squaring said squared quantities, first means for dividing said last summed quantity by 9, second means for dividing the output of said third means for summing by ⅓ and ½ and means for squaring said last divided output, and said means for calculating further including first means for determining the absolute value of the output of said first means for dividing and said last squared quantity, means for determining the square root of said absolute value, second means for determining the absolute value of said first means for dividing in accordance with the sign of the phase sequence, and said calculating means futher including means for determining the square root of said second means for determining the absolute value to determine the positive and negative sequence current.

4. Apparatus as claimed in claim 3 further comprising analog to digital converter means for converting the phase currents and means for determining the root mean square of the converted phase currents before said means for calculating calculates said positive and negative sequence currents.

5. A method according to claim 1, in which in the case of a phase sequence RST, a plus sign in the arithmetical expression gives a positive sequence current and a minus sign in the arithmetical expression gives a negative sequence current.

6. A method according to claim 1, in which in the case of a phase sequence RTS, a plus sign in the arithmetical expression gives a negative sequence current and a minus sign in the arithmetical expression gives a positive sequence current.

7. A device according to claim 2, in which means is provided to eliminate any zero-sequence current arising in the case of a grounded load.

8. A device according to claim 3, in which means is provided to eliminate any zero-sequence current arising in the case of a grounded load.

9. A device according to claim 4 in which means is provided to eliminate any zero-sequence current arising in the case of a grounded load.

* * * * *